US012593735B2

(12) United States Patent
Chaji

(10) Patent No.: US 12,593,735 B2
(45) Date of Patent: Mar. 31, 2026

(54) COLOR OPTOELECTRONIC SOLID STATE DEVICE

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/568,577

(22) PCT Filed: Jun. 10, 2022

(86) PCT No.: PCT/CA2022/050930
§ 371 (c)(1),
(2) Date: Dec. 8, 2023

(87) PCT Pub. No.: WO2022/256937
PCT Pub. Date: Dec. 15, 2022

(65) Prior Publication Data
US 2024/0292724 A1     Aug. 29, 2024

Related U.S. Application Data

(60) Provisional application No. 63/293,694, filed on Dec. 24, 2021, provisional application No. 63/275,079, (Continued)

(51) Int. Cl.
*H10W 90/00* (2026.01)
*G02B 6/42* (2006.01)
(Continued)

(52) U.S. Cl.
CPC .......... *H10W 90/00* (2026.01); *G02B 6/4214* (2013.01); *H10K 59/38* (2023.02); *H10K 59/70* (2023.02);
(Continued)

(58) Field of Classification Search
CPC ....... H10K 59/90; H10K 59/70; G02B 6/4214
See application file for complete search history.

(56) References Cited

U.S. PATENT DOCUMENTS

2007/0047261 A1* 3/2007 Thompson ........ G02F 1/133606
362/623
2010/0220484 A1* 9/2010 Shani ................... G02B 6/0025
362/296.09
(Continued)

FOREIGN PATENT DOCUMENTS

CN         108206234 A      6/2018
JP         2010035134 A     2/2010
(Continued)

OTHER PUBLICATIONS

WIPO: International Search Report and Written Opinion relating to WO application No. PCT/CA2022/050930, dated Aug. 25, 2022.
(Continued)

*Primary Examiner* — Kretelia Graham
*Assistant Examiner* — Mikka Liu

(57) ABSTRACT

Structures and methods are disclosed for fabricating a color optoelectronic solid state array device. In one embodiment, different color devices and optical structures are combined to form a color optoelectronic solid state array. The optical structure comprise of light distribution layer, light extraction layer, waveguide, reflective layers, linear color combinator. In another embodiment, a method to combine light colors in a color microdevice array is disclosed.

8 Claims, 16 Drawing Sheets

FIG. 6A

Related U.S. Application Data filed on Nov. 3, 2021, provisional application No. 63/245,450, filed on Sep. 17, 2021, provisional application No. 63/209,198, filed on Jun. 10, 2021.

(51) Int. Cl.

| | |
|---|---|
| *H10K 59/38* | (2023.01) |
| *H10K 59/70* | (2023.01) |
| *H10K 59/80* | (2023.01) |
| *H10K 102/00* | (2023.01) |

(52) U.S. Cl.
CPC ......... *H10K 59/875* (2023.02); *H10K 59/878* (2023.02); *H10K 2102/331* (2023.02)

(56) References Cited

U.S. PATENT DOCUMENTS

| | | | |
|---|---|---|---|
| 2016/0154193 A1* | 6/2016 | Brukilacchio | ......... G02B 5/003 385/33 |
| 2018/0175268 A1 | 6/2018 | Moon et al. | |

| | | | |
|---|---|---|---|
| 2018/0287027 A1 | 10/2018 | Chaji | |
| 2018/0348577 A1* | 12/2018 | Pousthomis | ......... C09K 11/025 |
| 2018/0358405 A1 | 12/2018 | Chaji et al. | |
| 2019/0288156 A1 | 9/2019 | Chaji et al. | |
| 2020/0395521 A1* | 12/2020 | Brodoceanu | ............ H01L 24/83 |

FOREIGN PATENT DOCUMENTS

| | | |
|---|---|---|
| TW | 201909406 A | 3/2019 |
| WO | 2011045904 A1 | 4/2011 |
| WO | 2021016761 A1 | 2/2021 |

OTHER PUBLICATIONS

TW IPO Office Action relating to TW Application No. 109135241 dated Nov. 4, 2024 Nov. 4, 2024.
CNIPA: CN Office Action relating to CN application No. 202080068337.X, dated May 24, 2025.
CNIPA: CN Office Action relating to CN application No. 202080068337.X May 24, 2025.

* cited by examiner

1204

1232

1234

1230

1136

1132

1130

1120

1110

1100

COLOR OPTOELECTRONIC SOLID STATE DEVICE

FIELD OF THE INVENTION

The present disclosure relates to optoelectronic solid state array devices and more particularly relates to forming color arrays of microdevices using different microdevices.

SUMMARY

According to one embodiment, there is a method to combine color from different sources in an optoelectronics device, the method comprising, having a first array of optoelectronic devices coupled to a waveguide structure, passing a light from the array to one side of the waveguide or the light from the one side being passed to the first array; and redirecting an input light or output light on the one side of the waveguide by a reflector in a substantially a same direction as a light direction in a waveguide.

According to another embodiment, the invention relates to an optoelectronic device comprising of, a first array of optoelectronic devices coupled to a waveguide structure passing a light from the array to one side of the waveguide or the light from the one side being passed to the first array and a reflector at the one side of the waveguide redirecting the light so that it is almost in the same direction as a light direction in the waveguide.

According to another embodiment, the invention relates to a method to combine light colors in a color microdevice array, the method comprising, combining light colors from different image sources using a linear color combinator, having the image sources on one side of linear color combinator, redirecting light generated by different image sources using a reflector, converting least one of the image sources to a different color using color conversion layers, having a frontplane for image sources to produce or capture a light per pixel, having a backplane for controlling or extracting the output of the frontplane per pixel and coupling the image sources to fewer than two surfaces of the linear color combinator.

According to another embodiment, the invention relates to pixel structure comprising, a set of micro devices, and a light mixing structure formed on top of the set of devices wherein an area surface between the light mixing structure is filled with a black matrix or reflective layers.

BRIEF DESCRIPTION OF THE DRAWINGS

The foregoing and other advantages of the disclosure will become apparent upon reading the following detailed description and upon reference to the drawings.

Figure 1:
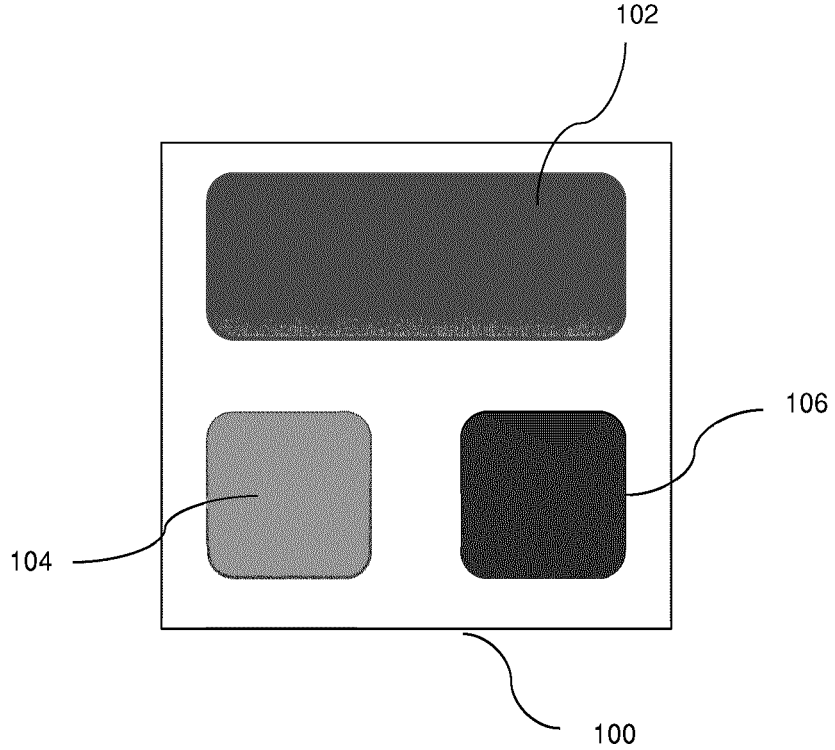
FIG. 1 shows a pixel structure that the red microLED is larger.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION OF THE INVENTION

In this description, the term "device" and "microdevice" are used interchangeably. However, it is clear to one skilled in the art that the embodiments described here are independent of the device size.

The present disclosure is related to a microdevice array, wherein the microdevice array may be bonded to a backplane with a reliable approach. The microdevices are fabricated over a microdevice substrate. The microdevice substrate may comprise micro light emitting diodes (LEDs), inorganic LEDs, organic LEDs, sensors, solid state devices, integrated circuits, microelectromechanical systems (MEMS), and/or other electronic components. The substrate may be the native substrate of the device layers or a receiver substrate where device layers or solid state devices are transferred to. Although microLED and display may have been used to explain an invention, the same technique can be used for other applications.

The backplane (or system) substrate may be any substrate and can be rigid or flexible. The backplane substrate may be made of glass, silicon, plastics, or any other commonly used material. The backplane substrate may also have active electronic components such as but not limited to transistors, resistors, capacitors, or any other electronic component commonly used in a system substrate. In some cases, the system substrate may be a substrate with electrical signal rows and columns. The backplane substrate may be a backplane with circuitry to derive microdevices.

In most microdevice structures, the devices associated with higher wavelengths have lower performance. In one embodiment shown in FIG. 1, a pixel structure 100 is used where the microdevice 102 associated with larger wavelength is larger than the other microdevices 104, 106.

Figure 2:
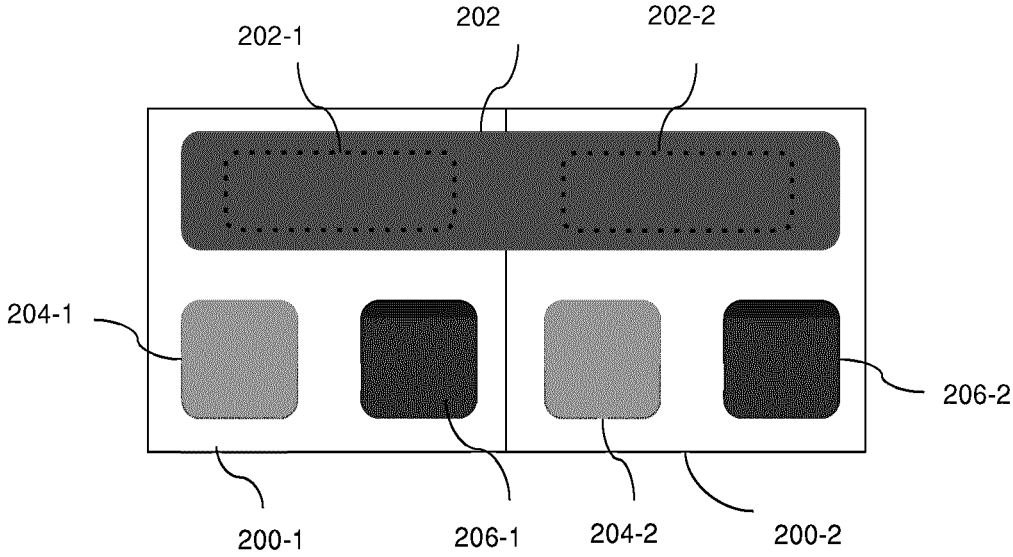
FIG. 2 shows a pixel structure with one shared monolithic microdevice.

In another pixel structure 200-1, 200-2 shown in FIG. 2, the device 202 more sensitive to size reduction compared to other devices 204-1, 204-2, 206-1, 206-2 is shared between two adjacent pixels. To create further pixelation, the device 202 is modified to have individual device effects 202-1, 202-2. In one case, the modification is done by using two independent contacts for each sub device 202-1, 202-2. Furthermore, one can modify the resistance of the doped layers between the two contacts for the sub devices. In the case of flip chip structure, one common contact can be used for the sub devices in the monolithic device.

Figure 3A:
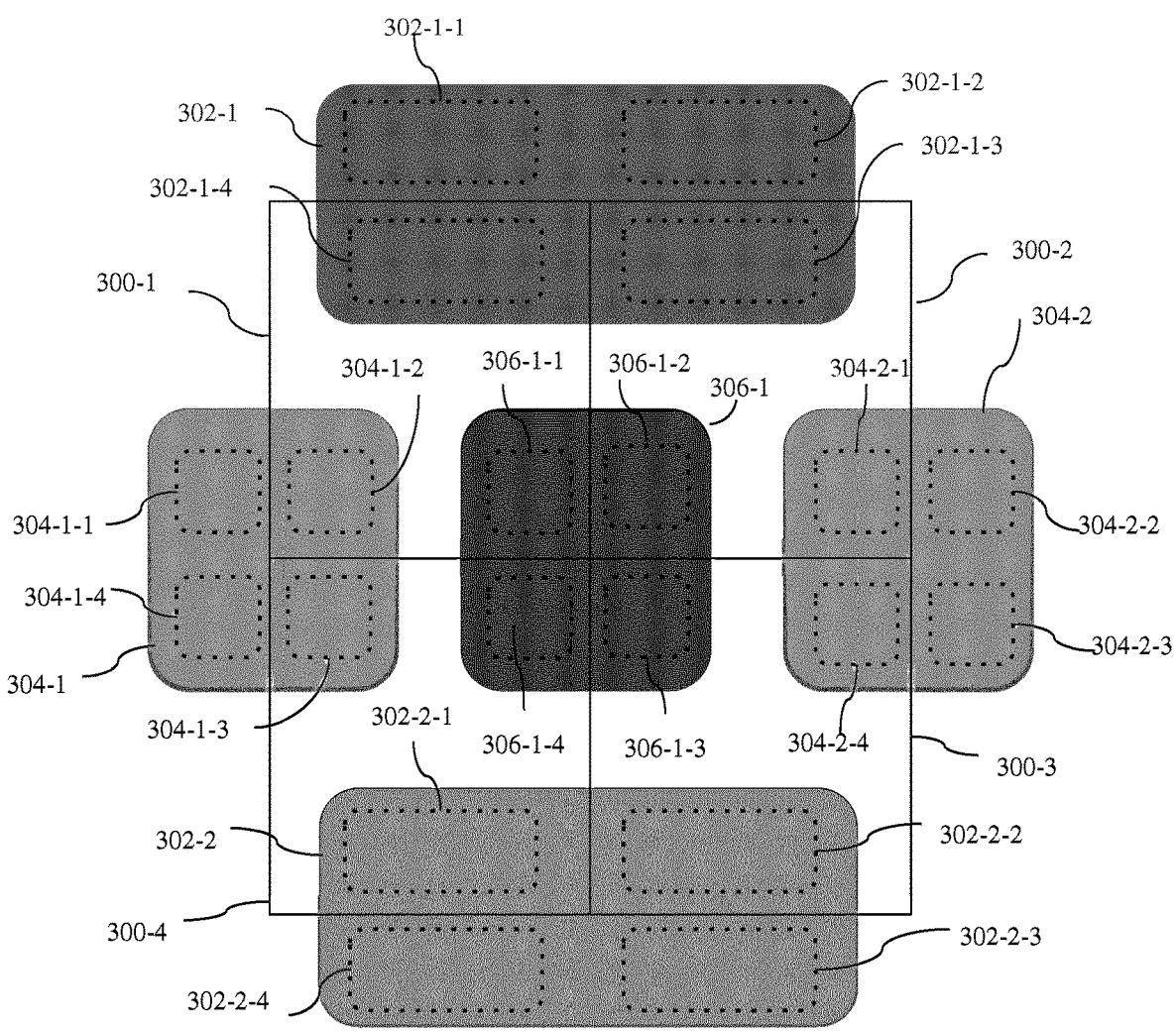
FIG. 3A shows a pixel structure with more than one shared monolithic microdevice.

In FIG. 3A, another pixel structure 300-1, 300-2, 300-3, 300-4, the pixel orientation is changed so that the devices of the same type are in the same places. Therefore, a monolithic 302-1, 302-2, 304-1, 304-2, and 306-1 device can be used for the same device in the adjacent pixel. To create further pixelation, the device 302-1, 302-2, 304-1, 304-2, 306-1, is modified to have individual device effect 302-1-1 to 4, 302-2-1 to 4, 304-1-1 to 4, 304-2-1 to 4, 306-1-1 to 4, 306-2-1 to 4. In one case, the modification is done by using two independent contacts for each sub device: 302-1-1 to 4, 302-2-1 to 4, 304-1-1 to 4, 304-2-1 to 4, 306-1-1 to 4, 306-2-1 to 4. Furthermore, one can modify the resistance of the doped layers between the two contacts for the sub devices 302-1-1 to 4, 302-2-1 to 4, 304-1-1 to 4, 304-2-1 to 4, 306-1-1 to 4. To reduce the effect of pixel orientation variation, a light/color diffuser structure can be developed on top of each pixel. This structure can be lens or patterned transparent layer.

Figure 3B:
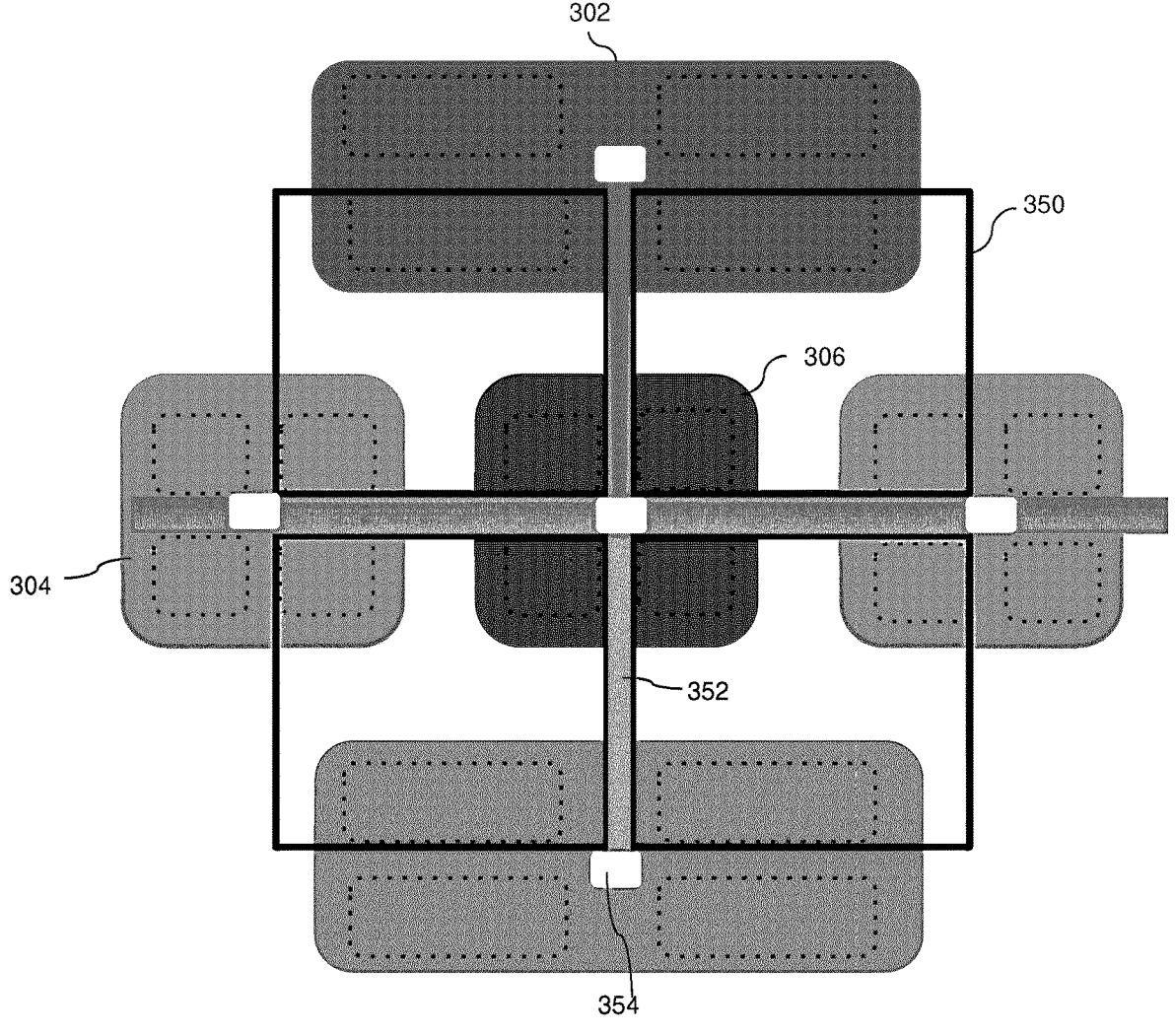
FIG. 3B shows light mixing structure is formed on top of a set of devices in one pixel.

In one related embodiment, shown in FIG. 3B, a light mixing structure 350 is formed on top of a set of devices in one pixel. The structure can be formed by dielectric or polymer. It can be shaped as lens. The area surface between the light mixing structure 350 can be filled with blackmatrix or reflective layers 352. In another related embodiment, a reflector layer 352 can be formed between the light mixer structures 350. The reflector 352 can cover at least part of the side wall of the light mixing structures 350. The reflector layers 352 can also be an electrode coupled to the devices. An ohmic contact layer 354 can be formed on the devices 302, 304, and 306. The light mixing structure can have embedded reflective particles to further mix the lights from individual effects of each device 302, 304, and 306. The reflective particles can be nano silver particles.

One embodiment is the process of making a high resolution optoelectronic system with at least two different devices per pixel. Here the backplane is designed so that at least one of the devices adjacent between adjacent pixels are the same device type. As a result, the device can be made of one device. The current path in the device can be separated to at least two pads associated with two adjacent pixels. Each current path is coupled to two pads where each pad exists in two adjacent pixels. The coupling can be done through bonding or electrode deposition. Other devices are also transferred and coupled to the pixels. The devices can be more secured by an underfill layer. In another related case, planarization layers can be formed and opened to provide access to top electrodes if needed. In another related case, light mixing layers are formed on top of the pixel area and at least partially isolated to create pixel effect. The polarization and light mixing layer can be the same. Black matrix or reflective layer can be deposited and patterned to fill at least part of the area between the light mixing layers. The black matrix or reflective layers can cover part of the light mixing walls or get extended to part of the top surface.

Figure 3C:
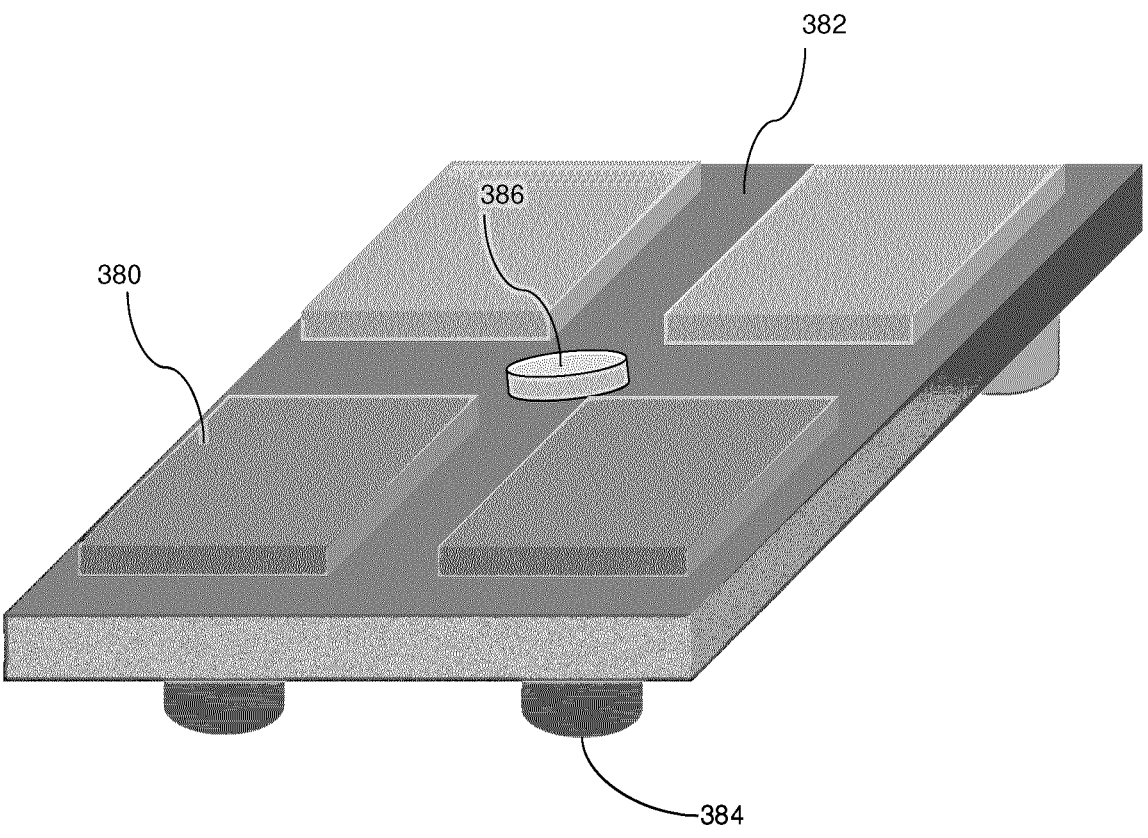
FIG. 3C shows the top of the device has grooves between the individual device effects.

In one related embodiment shown in FIG. 3C, the top of the devices 302, 304, and 306 can have grooves 382 between the individual device effects 380. There is at least one pad 384 associated with each individual area 380. There can be a common ohmic layer or pad 386 between the individual areas 380.

Figure 3D:
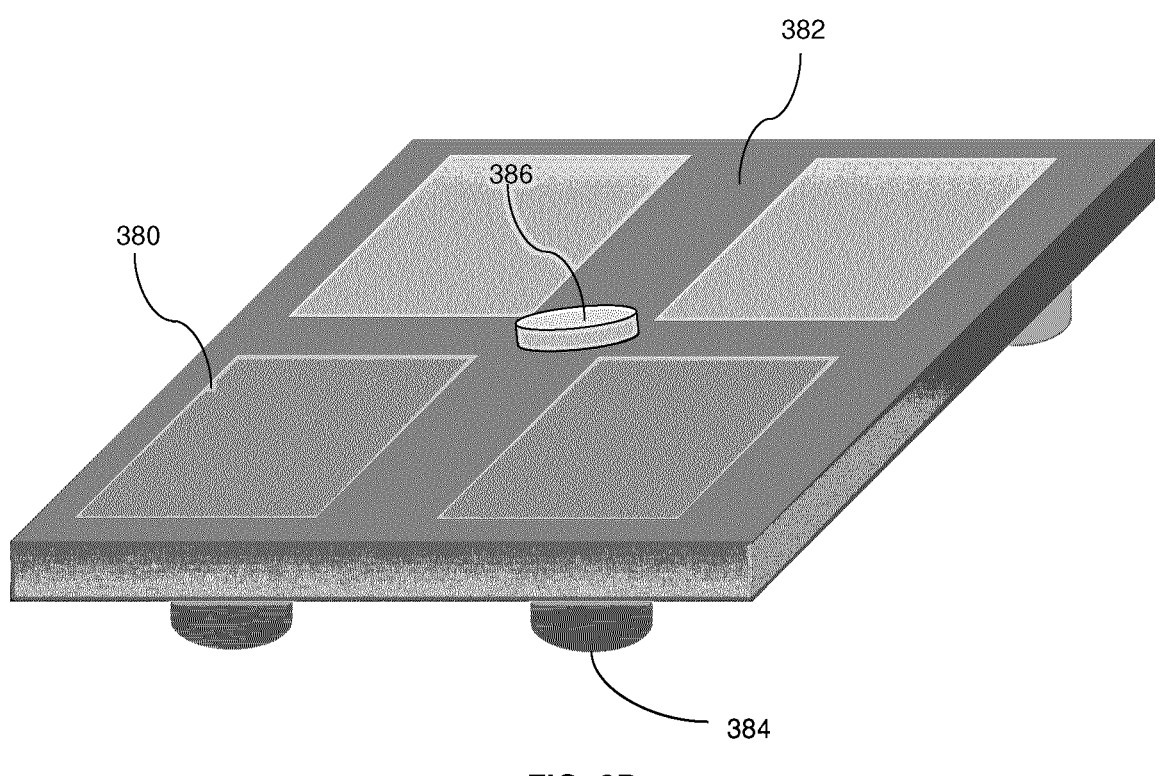
FIG. 3D shows the area associated with the individual device is textured while the space between the device is not modified.

In another related embodiment shown in FIG. 3D, light extraction layer 380 is developed on the area associated with the individual device. In one related embodiment the light extraction layer 380 is developed by texturing the surface while the space 382 between the devices is not modified. The structure can enable more light extraction from the area of each individual device effect 380. The texture 380 layer can be created by wet processing, or dry etching. In another related embodiment, layer 380 includes a stack of material to enhance the light outcoupling from the device. The light extraction layer can be a dielectric layer.

Figure 3E:
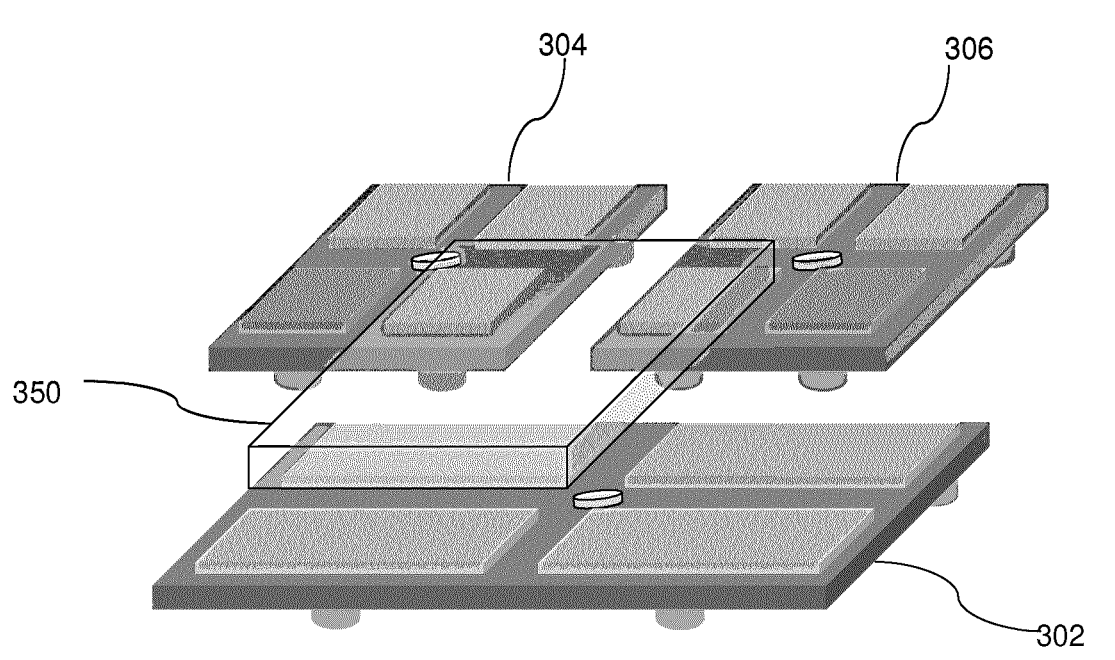
FIG. 3E shows a three dimensional view of an optoelectronic pixel with three different devices.

FIG. 3E shows a three dimensional view of an optoelectronic pixel with three different devices 304, 302, 306, and the light mixing structure 350. The devices have individual area effects. The devices can be light emitting devices or sensors.

In another embodiment for FIGS. 3A to 3E, shows an optoelectronic device having an array of pixels. Here, each pixel has more than one type of microdevice in a pixel structure such as 300-1, 300-2, 300-3, 300-4, and the four adjacent pixels have one type of microdevice common in one cluster. Further, the light distribution layer 350 covers at least more than two types of microdevice in one pixel. Moreover, the space between the light distribution layer of two pixels is covered by a black matrix or a reflective layer 352. In addition, the light distribution layer can be a polymer or a dielectric layer and can have reflective nanoparticles. Here the microdevices can be OLED, microLED, sensors, and other types of devices.

In one related embodiment, shown in FIG. 3B, a light mixing structure 350 is formed on top of a set of devices in one pixel. Here the optoelectronic device has an array of pixels. Here, each pixel has more than one type of microdevice in a pixel structure such as 300-1, 300-2, 300-3, 300-4, and the four adjacent pixels have one type of microdevice common in one cluster. The structure can be formed by dielectric or polymer. It can be shaped as lens. The area surface between the light mixing structure 350 can be filled with blackmatrix or reflective layers 352. In another related embodiment, a reflector layer 352 can be formed between the light mixer structures 350. The reflector 352 can cover at least part of the side wall of the light mixing structures 350. The reflector layers 352 can also be an electrode coupled to the devices. An ohmic contact layer 354 can be formed on the devices 302, 304, and 306. The light mixing structure can have embedded reflective particles to further mix the lights from individual effects of each device 302, 304, and 306. The reflective particles can be nano silver particles.

In another approach a monolithic device is used for more than one pixel and to achieve color different devices are stacked on top of each other.

Figure 4:
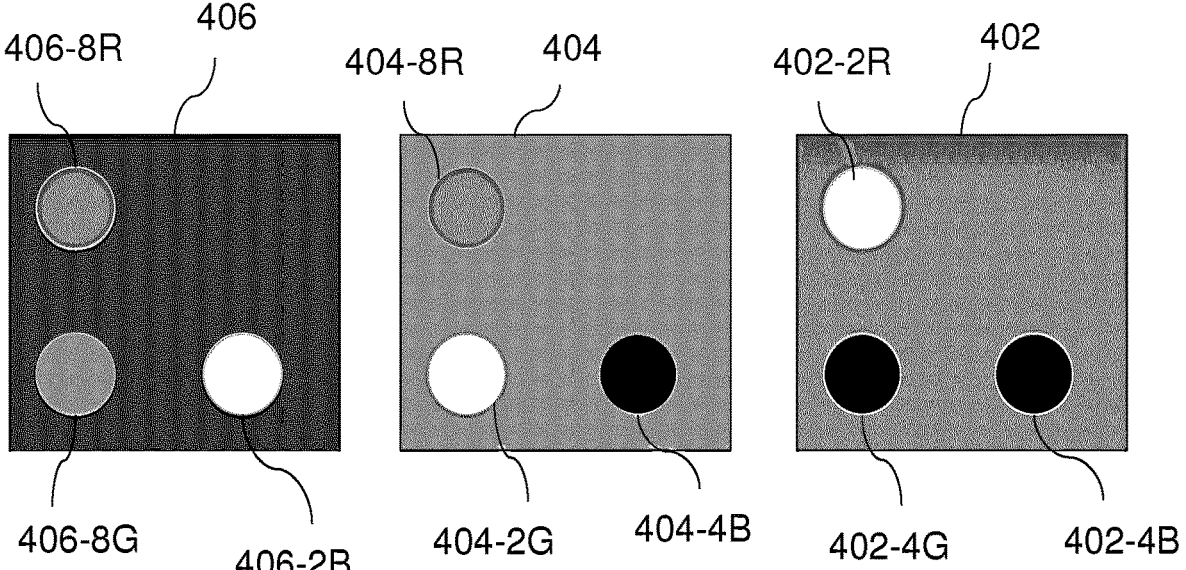
FIG. 4 shows the stacking structure of different microdevice arrays to form a color array.

Here, the monolithic devices are turned to different pixelation by modulating the contact layer(s) resistance. Furthermore, the modulation may create a higher resolution sub device array compared to the pads on the backplane for each device. This enables lower alignment accuracy needed for connecting the devices to the backplane. As shown in FIG. 4, a first monolithic device (array) 402 is transferred to a substrate (backplane or temporary or another monolithic device (array). The first monolithic device 402, has a connection pad 402-2R that will be bonded to the respective pad on the backplane. Then areas 402-4G, 402-4B associated with the pads for the other device (array) are opened in the said transferred monolithic device 402 (array). The opening 402-4G 402-4B is passivated and filled to form a pad for the next device 404 (array). Before or after the opening, or at the same time as filling the opening, a common electrode may get deposited for the first transferred monolithic device. Then, the second device 404 (array) is transferred (or bonded) to the said first transferred monolithic device (array) 402. The said second monolithic device 404 also has a connection pad 404-2G and an opening 404-4B for the third device (if needed).

The second device can be a monolithic device or a simulated device. If the second device 404 is monolithic, there can be opening 404-8R also on the second device associated with the active area of the first monolithic device 402.

The opening 404-4B is passivated and filled to form a pad for the next device 406 (array). Before or after the opening, or at the same time as filling the opening, a common electrode may get deposited for the first transferred monolithic device. Then, the third device 406 (array) is transferred (or bonded) to the said second transferred monolithic device (array) 404. The said third device 406 also has a connection pad 406-2B.

The third device can be a monolithic device or a simulated device. If the third device 406 is monolithic, there can be openings 406-8R and 406-8G also on the third device 406 associated with the active area of the first device 402 and second device 404.

Figure 5:
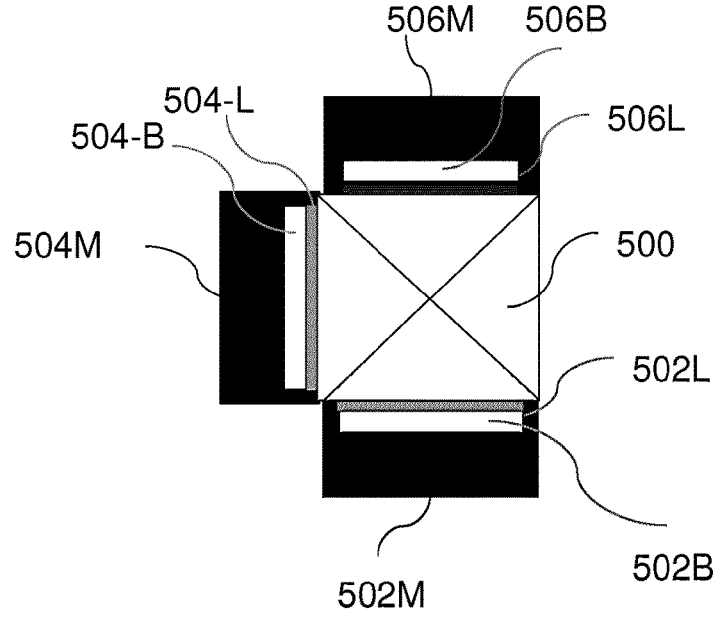
FIG. 5 shows the existing approach on using dichroic prisms to form color displays.

FIG. 5 shows another approach to make color devices. Here, a dichroic prism 500 is used to combine the light from three mono color devices 502, 504, 506. The mono color devices can have a frontplane 502-L, 504-L, 506-L for creating the light and backplane 502-B, 504-B, 506-B for controlling the light output per pixel. Also, mechanical structures 502M, 504M, 506M are used for packaging, thermal management, or electrical connections. The challenge for this approach is that it is very bulky and not a good fit for wearable electronics such as augmented reality devices. The other challenge is that the devices need to be aligned very accurately which is difficult for high pixel density devices.

Figure 6A:
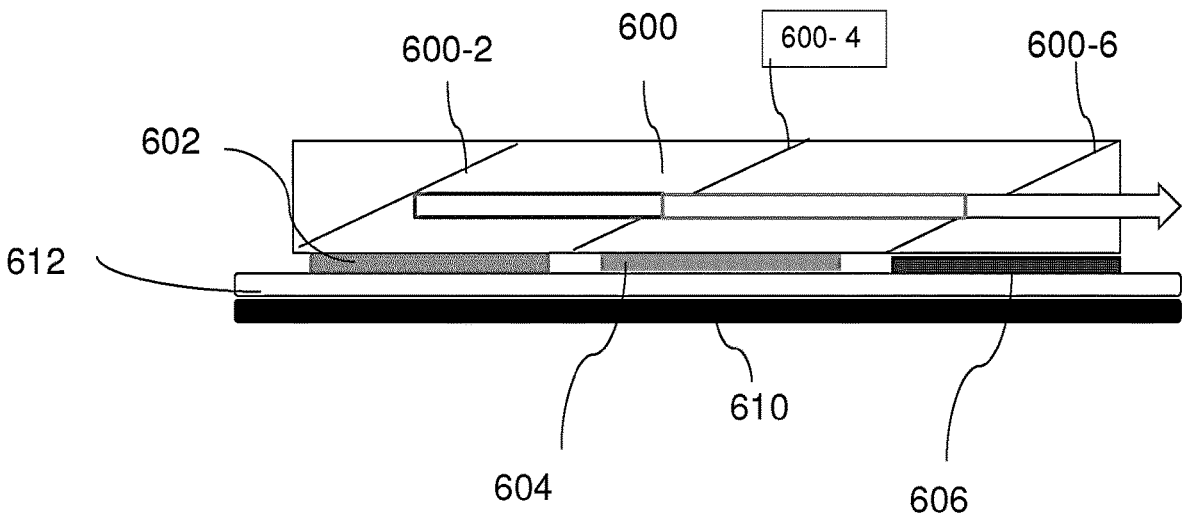
FIG. 6A shows an embodiment using serial dichroic optics to form a color array.

FIG. 6A introduces a new embodiment where a linear color combinator 600 is used to combine the color from different sources 602, 604, 606. Here, the sources (image array) are on one side of the light combinator. The light generated by either of the light sources is redirected to the same direction using a reflector 600-2. The reflector also allows the image from the previous source to pass through. Here, the image sources can be a different type of light emitting devices such as microLED and/or OLED. A single backplane 612 can be used for driving the frontplane associated with each image source. The driving and interfaces can be shared in such cases. In other cases, different backplanes can be used for at least two different frontplanes. Here, the combination of frontplane and backplane can be secured on a mechanical structure 610. Here, the alignment comes from the position accuracy of the image sources on the backplane (or mechanical structure). As a result, high alignment accuracy can be achieved without significant overhead. Furthermore, the combined structure is very compact in all three dimensions.

In one case, the reflector 600-2, 600-4, and 600-6 can be dichroic mirrors (or prisms). Here, the mirror reflects the light below a cutoff wavelength and passes the lights within a bandwidth. The arrangement can be different if the image source is a sensor or a display. The following is for display applications, but the same principle can be used to develop setup for sensors. The following setup is for 3 light sources, but a similar arrangement can be used for more image sources. The assumption is that the wavelength generated by image source 602 is between W2L and W2H (W2L<W2H) where W2L and W2H defines the passing bandwidth of the mirror, image source 604 is between W4L and W4H (W4L<W4H), and by image source 606 is between W6L and W6H (W6L<W6H). The mirror 600-2 cutoff wavelength is larger than W2H (one can use smaller than W2H to cut some unwanted wavelengths from the image source). The mirror 600-4 cutoff wavelength is between W2L and W4H (W4H<W2L) (one can use smaller than W4H to cut some unwanted wavelengths from the image source). The mirror 600-6 cutoff wavelength is between W4L and W6H (W6H<W4L) (one can use smaller than W4H to cut some unwanted wavelengths from the image source). Here, the mirror 600-2 reflects a part of the light generated by light source 602. The mirror 600-4 reflects a part of the light generated by light source 604 and passes part of the light coming from the mirror 600-2. The mirror 600-6 reflects a part of the light generated by light source 606 and passes part of the lights coming from the mirror 600-4. If the light from the sources has overlap in wavelength, the selection of cutoff wavelength can be done based on the optimization of color point or power consumption or other parameters.

The reflector can be made of different optical layers with different optical properties or made out of grating structure.

Figure 6B:
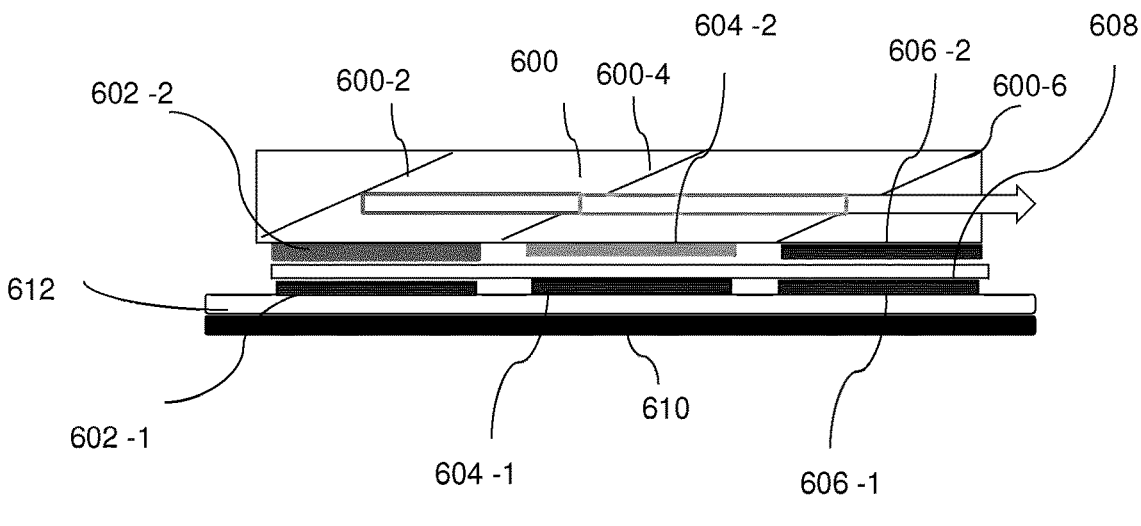
FIG. 6B shows an embodiment where a linear color combinator is used to combine the color from different sources.

FIG. 6B introduces a new embodiment where a linear color combinator 600 is used to combine the color from different sources 602-1, 604-1, and 606-1. Here, the sources (image array) are on one side of the light combinator. The light generated by either of the light sources is redirected to the same direction using a reflector 600-2. The reflector 600-2 also allows the image from the previous source to pass through. Here, the image sources can be a different type of light emitting devices such as microLED and/or OLED. A single backplane 612 can be used for driving the frontplane associated with each image source 602-1, 604-1, and 606-1. The driving and interfaces can be shared in such cases. In other cases, different backplanes can be used for at least two different frontplanes. Here, the combination of frontplane and backplane can be secured on a mechanical structure 610. Here, the alignment comes from the position accuracy of the image sources on the backplane (or mechanical structure). As a result, high alignment accuracy can be achieved without significant overhead. Furthermore, the combined structure is very compact in all three dimensions. In one related case, at least for one of the image sources 602-1, 604-1, 606-1 is converted to a different color using color conversion (or color filter or combination) layer 602-2, 604-2, 606-2. There can be a gap 608 between the image sources and color conversion (color filter or combination) layers. This gap can guide the light to the color conversion layers. Furthermore, it can protect the color conversion layer from any heat generated on the image sources. The gap can be made with polymer, dielectric, or other materials. The color conversion (color filter or combination layer) can be passivated to protect it from environmental impacts. In one related case, the color conversion (color filter or combination layer) layer is formed on the surface of the image source. In another related case, the color conversion (color filter or combination layer) layer is formed on the surface of the light combiner structure. Here, the light combiner structure can act as a heat sink for both the image source or the color conversion layer. In one related case, the color filter can be part of the reflector surface 600-2. It blocks the unwanted color to pass through or reflect through. In another related case, the color conversion layer can also be part of the reflector layer 600-2. Here the image source generates the light, and the reflector surface converts the light during the reflection process or during the pass through process. The color conversion can be different materials such as quantum dots, or phosphors or other nanoparticles.

Figure 6C:
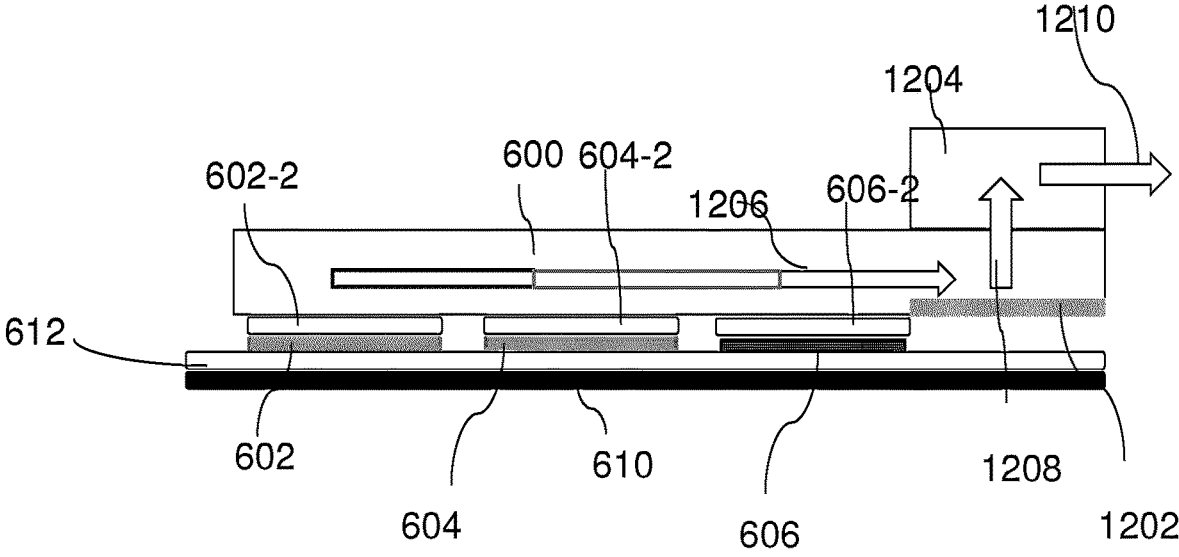
FIG. 6C shows an array of optoelectronic devices coupled to a waveguide structure.

FIG. 6C shows another related embodiment. The structure described in FIG. 6A-D can be applied to other embodiments described in this document. Here, a first array of 602 of optoelectronic devices is coupled to a waveguide structure 600. There can be an optical device/layer 602-2 between the first array 602 and the waveguide structure 600. The waveguide 600 passes the light from the array to one side of the waveguide or the light from one side is passed to the first array 602. A second array of optoelectronic devices 604 is coupled to the waveguide structure 600. The waveguide passes the light to the same direction as the light from the first array 602. There can be a third array 606 coupled to a waveguide 600. The light from the third array 606 is passed to the same direction as the first and second arrays 602, 604. There can be light coupling structure 604-2, 606-2 between the second and third arrays 604, 606 and the waveguide 600. The waveguide 600 can be a stack of different waveguides or single structure. The optoelectronic arrays 602, 604, 606 can be different devices such as microLED, OLED, QD, sensors, stack of different devices (E.g. microLED/OLED+QD, microLED/OLED+color filter) and other devices. The first, second and third arrays can be made of the same devices or different devices. In one related case, the arrays are made from the same devices to increase one characteristic of the array. For example, the brightness or resolution of the output image can be increased by using two or three arrays of microLED or OLED. In another related case, the arrays can be made of different devices to provide different functionalities. In one related example, the arrays can be different colors to provide for a full color display. The waveguide merges the output from the first, second or third array and reflects it as one output 1208. The reflection happens at one side 1202 of the waveguide 600. In most cases, the output may need to preserve its original direction of the light 1206. Here, a reflective optical structure 1204 is coupled to the side 1202 of the waveguide structure 600 with a reflected image 1208. The reflective structure 1204 reflects the image 1208 to an output 1210 that has the almost the same direction of original image 1206 and is different from the output image 1208 of waveguide 600. The output of reflective structure 1204 can be coupled to other optical devices to create augmented image or projected image. There can be more than two or three separate arrays. The arrays can be on the same backplane 612. Here the backplane can have areas for first, second or third arrays. Their backplane has the input/output interface to program the arrays or read the signal out of the arrays. The input/output interface can be shared between different arrays. The backplane can be on a mechanical structure 610. The mechanical structure can include connections to the backplane, thermal management setup, and packaging arrangement.

Figure 6D:
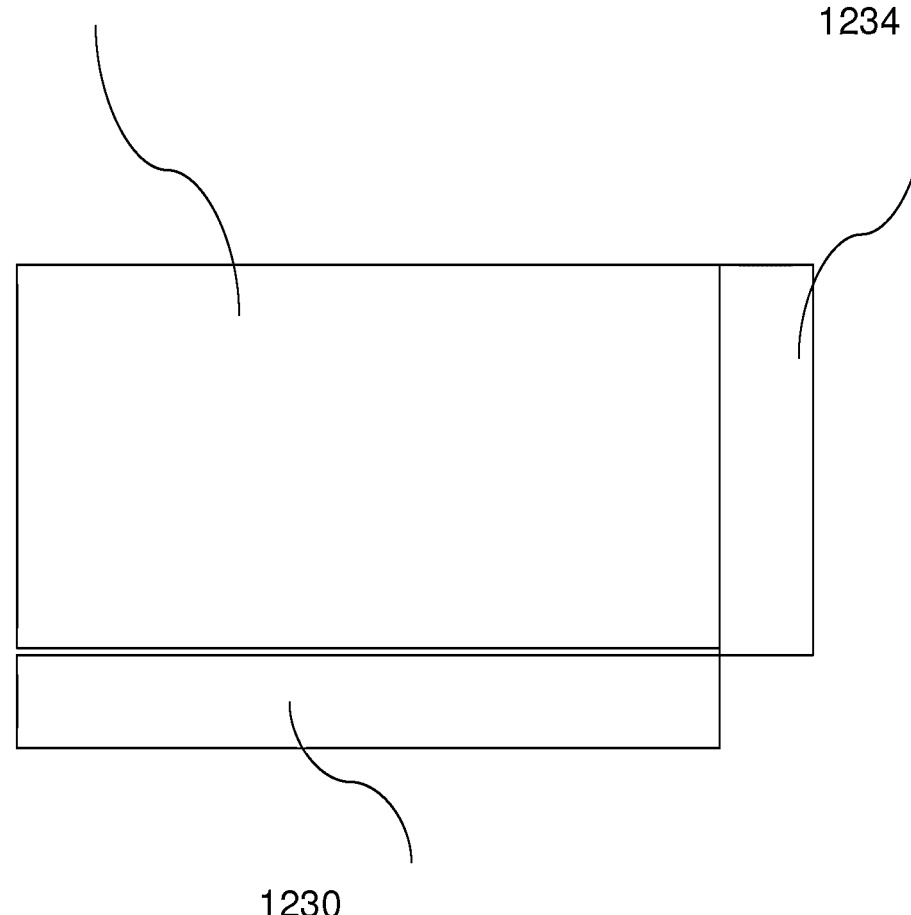
FIG. 6D shows an example of the reflective structure.

FIG. 6D shows an example of the reflective structure 1204. The structure 1204 can have an input coupling device 1230. The input coupling 1230 can be dielectric layers, optical adhesive/bonding or lens or combination of both. There can be a mirror or prism 1232 that reflects the input image. An output coupling device 1234 can be used to enhance the output light coupling/extraction. The output coupling device 1234 can be a dielectric layer, lens adhesive/bonding layer or combination of different devices and layers.

Figure 7:
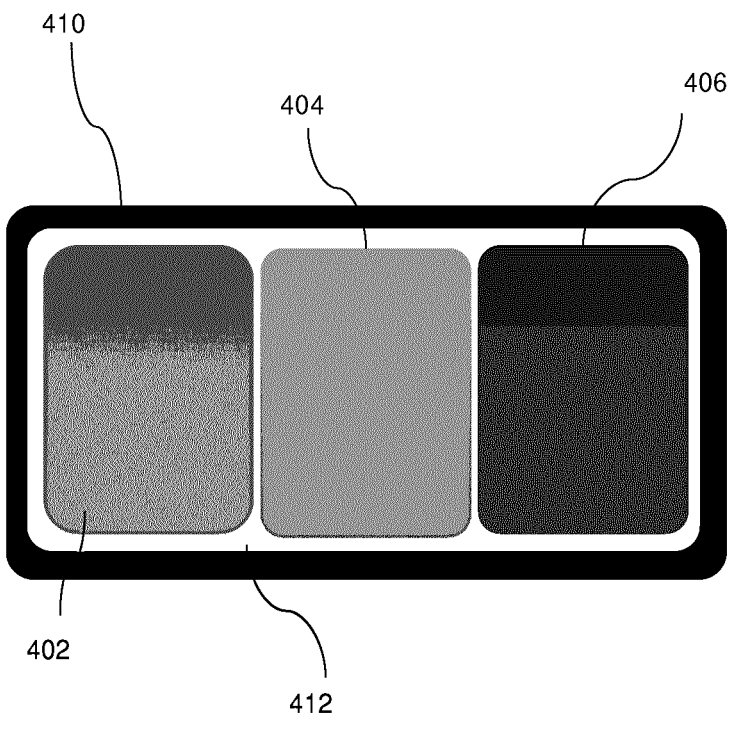
FIG. 7 shows a top view of individual arrays used in serial dichroic optics.

FIG. 7 shows a top view of an exemplary image source 402, 404, 406 arrangement. The front planes are located on backplane(s) 412. A mechanical structure 410 can be used for holding the structure in place and providing connection to the backplane. The mechanical structure can be part of the final applications (e.g., Augmented reality headset).

Figure 8:
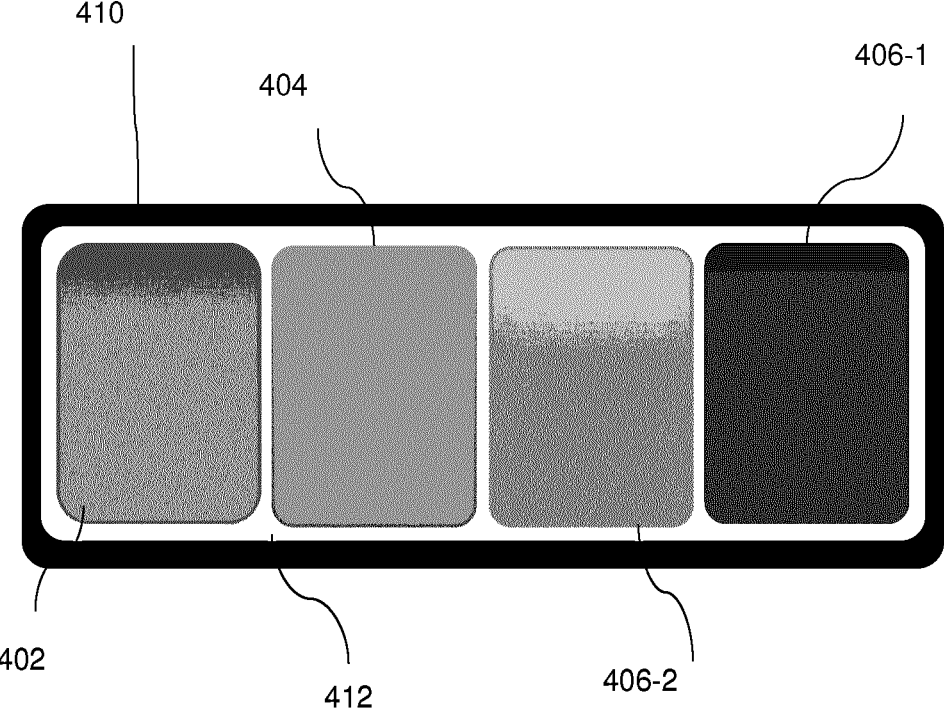
FIG. 8 shows the structure of using different types of the same microdevices to form a better performing color array.

One unique advantage of this embodiment is that it allows the integration of several image sources and is not limited to two or three. As a result, different image sources can be integrated to provide better power efficiency, more user friendly performance and different functionality. In one case, two types of image source can be used for at least one of the image sources: one with very high color purity and the other one with better power or user friendly performance. For example, in the case of blue, the pure blue light at high intensity can be harmful to users' eyes. As a result (in FIG. 8), two image sources can be used, one with pure blue 406-1 and the other one with lighter blue 406-2. For the majority of the cases where blue light is needed, light blue image source 406-2 is used. Only when pure blue is needed, one can activate the pure blue image source 406-1. Generally, the light blue has higher power efficiency which in turn can offer lower power consumption. The same can be used for other image sources as well.

In another embodiment, the same or different image sources can be used with less than one pixel offset respectively. As a result, when both are used together, it can offer much higher resolution images.

Figures 9A, 9B:
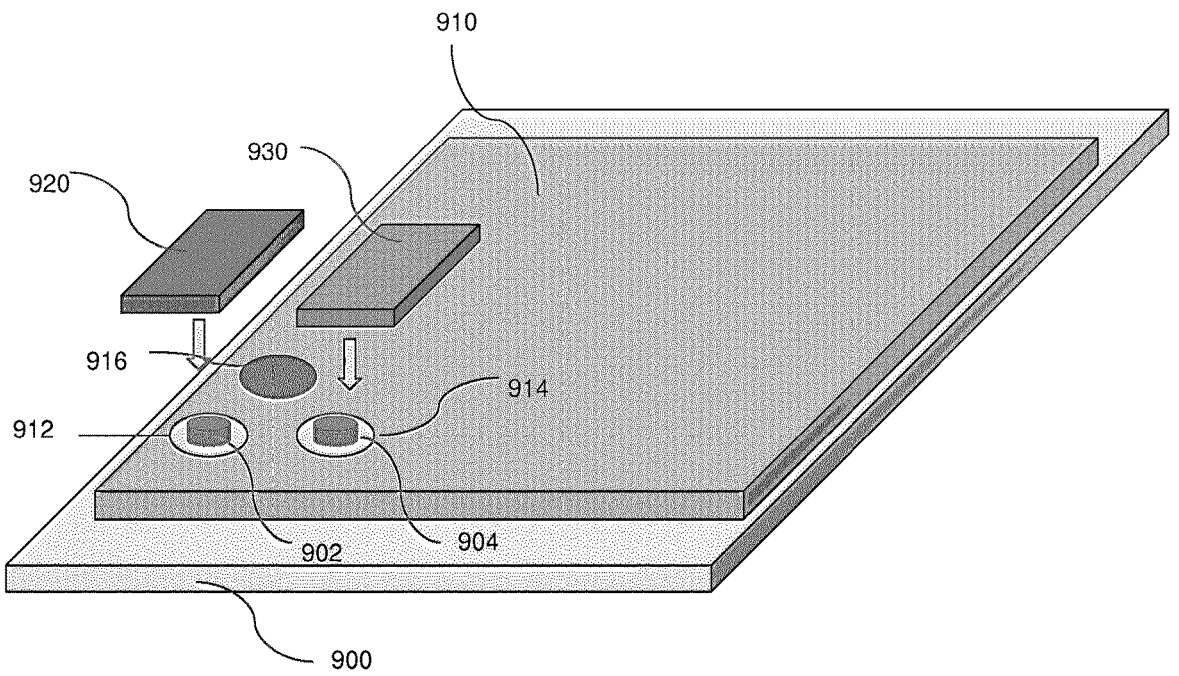
FIG. 9A shows one of the microdevices (array) formed as continuous pixelation.
FIG. 9B shows microdevices bonded to the pads.

In another embodiment demonstrated in FIGS. 9A and 9B, one of the microdevices (array) 916 is formed as continuous pixelation where the current is confined into small areas of the stacked layers of semiconductor 910 in at least one area to create an isolated microdevice effect (there can be an array of this current confinement structure to form an array of the microdevices). In one example, these stack layers can be the red epitaxial light emitting layers. The stacked layers 910 are bonded to a backplane 900 where the pads in the backplane define the sub pixels. Here, there can be post processing performed on the stacked layer 910 to further isolate the sub pixels (array) 916. The backplane 900 may have multiple sub pixels for each pixel in an array of pixels. There can be a pad for each subpixel and the current confinement structure (array) is bonded to the associated pads in the backplane sub pixel. There can be more than one current confinement structure associated with the pad in the backplane. The post processing can include current confinement, etching one or more of the top layers in the stacked layers 910. In one case, the stacked layers may have VIA's 912 and 914 before bonding to the backplane. The VIA's can be at least partially filled with a conductive layer separated from the walls of the VIA with a dielectric. The connection can couple a pad from the backplane to the top of the stack layer. In another case, electrical VIA's 912 and 914 are formed in the stacked layers 910 after the stacked layers 910 are bonded into the backplane. This process enables proper alignment of the opening with the pads in the other sub pixels in the backplane. The sidewall of the VIA's 912 and 914 can be passivated and pads 902 and 904 are formed either inside the VIA's 912 and 914 or on the walls of the VIA's 912 and 914. Microdevices 920 and 930 are bonded to the pads. There can be more than one pad or more than two VIAs for each microdevice. A conductive layer can be deposited on top of the microdevices 920 and 930 or the stacked layer 910.

Figure 10A:
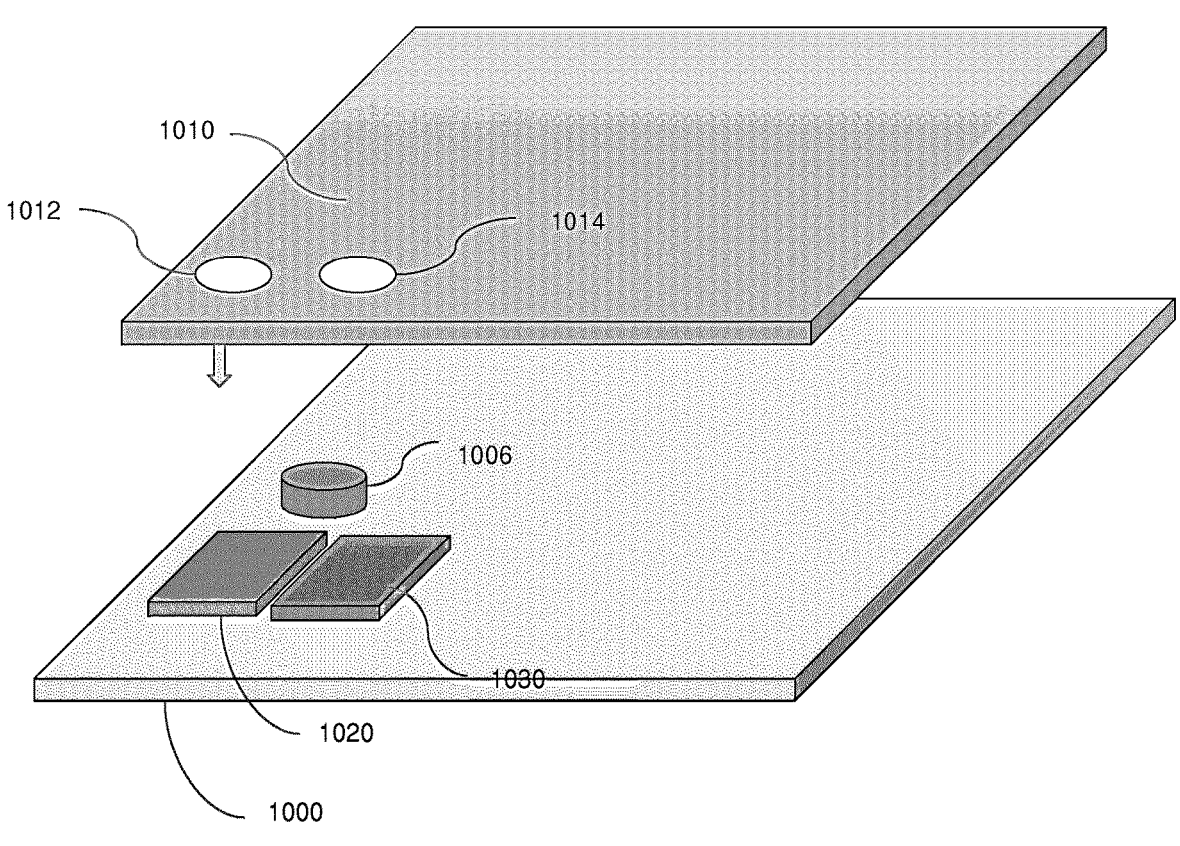
FIG. 10A shows one of the microdevices (array) formed as continuous pixelation with optical VIA's on the second stacked layer and a bump having a microdevice.
Figure 10B:
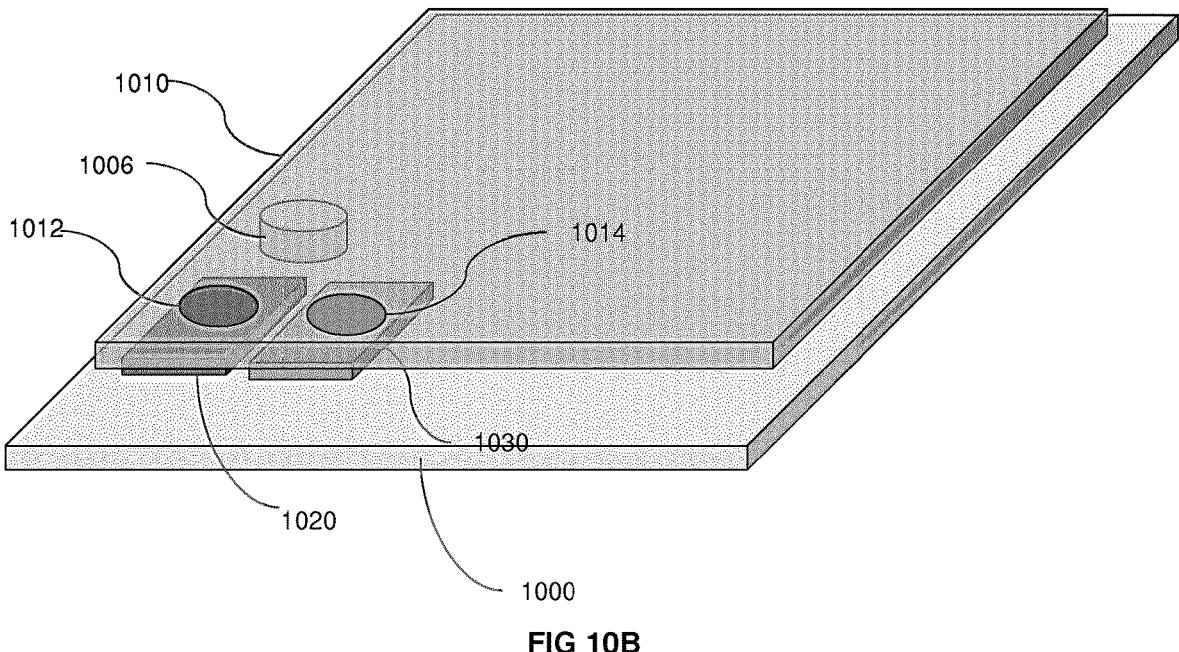
FIG. 10B shows microdevices in FIG. 10A bonded to the backplane.

In another embodiment demonstrated in FIGS. 10A and 10B, one of the microdevices (array) is formed as continuous pixelation where the current is confined into the stacked layers of semiconductor 1010 in at least one area to create an isolated microdevice effect (there can be an array of this current confinement structure to form an array of the microdevices). In one example, these stack layers can be the red epitaxial light emitting layers. The stacked layers 1010 are bonded to a backplane 1000 where the pads in the backplane define the sub pixels. Here, there can be post processing performed on the stacked layer 1010 to further isolate the sub pixels (array). The backplane 1000 may have multiple sub pixels for each pixel in an array of pixels. There can be a pad 1006 for each subpixel and the current confinement structure (array) is bonded to the associated pads in the backplane sub pixel. There can be more than one current confinement structure associated with the pad 1006 in the backplane. The post processing can include current confinement, etching one or more of the top layers in the stacked layers 1010.

In one case, the stacked layers may have VIA's 1012 and 1014 before bonding to the backplane. The VIA is to allow the light from the microdevices placed on the backplane pass through the stack layer 1010 (or the signal gets to the microdevices on the backplane). In another case, optical VIA's 1012 and 1014 are formed in the stacked layers 1010 after the stacked layers 1010 is bonded into the backplane. This process enables proper alignment of the opening with the microdevices 1020 and 1030 in the other sub pixels in the backplane. The sidewall of the VIA's 1012 and 1014 can be passivated and reflective layers formed on the walls. Microdevices 1020 and 1030 are bonded to the backplane prior to the bonding of the stacked layers 1010. There can be more than one pads or more than two VIA's for each microdevice. A conductive layer can be deposited on top of the microdevices 1020 and 1030 or the stacked layer 1010.

The bump 1006 can also include a microdevice similar to 1020 or 1030. Here, the microdevice can be formed to couple the backplane to a pad formed on top of the device. In another case, the array of microdevices 1020 and 1030 bonded to the backplane is tested. Before allocating a microdevice to form a bump 1006, the defective types are identified, and the set allocated for the bump will include some of the defective microdevices.

In another case, the stacked layer with current confinement is formed on the bonded microdevices on the backplane using other methods such as deposition. Here, planarization layers can be used to planarize the surface of the backplane with the microdevice and the stacked layers are formed on the planarization layer.

Figures 11A, 11B:
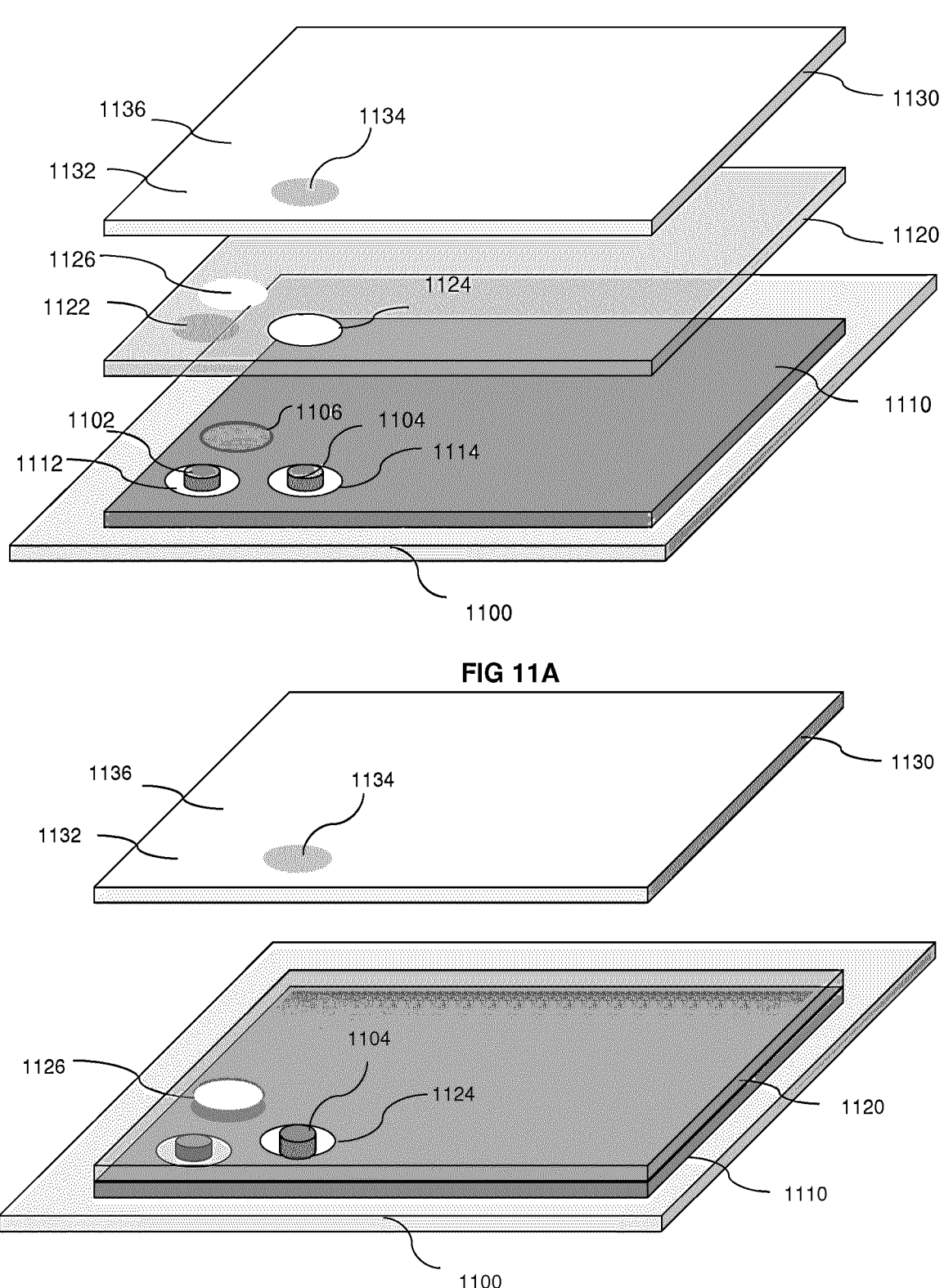
FIG. 11A shows three stacked layers of semiconductor with a microdevice array.
FIG. 11B shows two stacked layers bonded together with the top layer having optical VIA's.
Figure 11C:
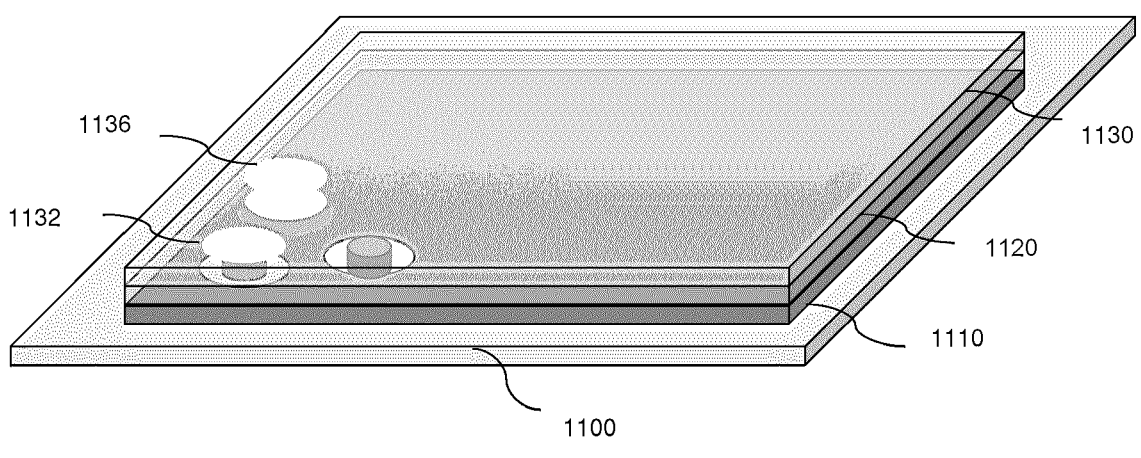
FIG. 11C shows three stacked layers bonded together with the top layer having optical VIA's.

In another embodiment demonstrated in FIGS. 11A and 11B and 11C, more than one microdevices (array) 1106, 1122, and 1134 are formed as continuous pixelation where the current is confined into the stacked layers of semiconductor 1110, 1120, and 1130 in at least one area to create an isolated microdevice effect (there can be an array of this current confinement structure to form an array of the microdevices). In one example, these stack layers can be the red, green, or blue epitaxial light emitting layers. The stacked layers 1110 is bonded to a backplane 1100 where the pads in the backplane define the sub pixels. Here, there can be post processing performed on the stacked layer 1110 to further isolate the sub pixels (array). The backplane 1100 may have multiple sub pixels for each pixel in an array of pixels. There can be a pad for each subpixel and the current confinement structure (array) 1106 is bonded to the associated pads in the backplane sub pixel. There can be more than one current confinement structure associated with each associated pad in the backplane. The post processing can include current confinement, etching one or more of the top layers in the stacked layers 1110. In one case, the stacked layers may have electrical VIA's 1112 and 1114 before bonding to the backplane. The VIA couples the associated pads 1102 and 1104 to the stack layer 1110 (or the signal gets to the microdevices on the backplane). In another case, electrical VIA's 1112 and 1114 are formed in the stacked layers 1110 after the stacked layers 1110 is bonded into the backplane. This process enables proper alignment of the opening with the microdevices in stacked layers 1120 and 1130 in the other sub pixels in the backplane. The sidewall of the VIA's 1112 and 1114 can be passivated and conductive layers formed on the walls.

The stacked layers 1120 are bonded to a backplane 1100 on top of the stacked layer 1110 where the pads in the backplane define the sub pixels. Here, there can be post processing performed on the stacked layer 1120 to further isolate the sub pixels (array) 1122. The backplane 1100 may have multiple sub pixels for each pixel in an array of pixels. There can be a pad for each subpixel and the current confinement structure (array) 1122 is bonded to the associated pads in the backplane sub pixel. There can be more than one current confinement structure associated with each associated pad in the backplane. The post processing can include current confinement, etching one or more of the top layers in the stacked layers 1120. In one case, the stacked layers 1120 may have electrical VIA's 1124 and optical VIA's 1126 before bonding to the backplane. The electrical VIA couples the associated pads 1104 to the stack layer 1130. The optical VIA allows the lights from the microdevice in stacked layer 1110 to pass through the stacked layer 1120 (or the signal gets to the microdevices on layer 1110). In another case, electrical VIA's 1124 and optical VIA's 1126 formed in the stacked layers 1120 after the stacked layers 1120 is bonded into the backplane. This process enables proper alignment of the opening with the microdevices in stacked layers 1110 and 1130 in the other sub pixels in the backplane. The sidewall of the VIA 1124 can be passivated, and conductive layers formed on the walls or a pad from inside the VIA 1124. The sidewall of the VIA 1126 can be coated with passivation and reflective layers.

The stacked layers 1130 are bonded to a backplane 1100 on top of the stacked layer 1120 where the pads in the backplane define the sub pixels. Here, there can be post processing performed on the stacked layers 1130 to further isolate the sub pixels (array) 1134. The backplane 1100 may have multiple sub pixels for each pixel in an array of pixels. There can be a pad for each subpixel and the current confinement structure (array) 1134 is bonded to the associated pads in the backplane sub pixel. There can be more than one current confinement structure associated with each associated pad in the backplane. The post processing can include current confinement, etching one or more of the top layers in the stacked layers 1130. In one case, the stacked layers 1130 may have optical VIA's 1132 and 1136 before bonding to the backplane. The optical VIA allows the lights from the microdevice in stacked layers 1110 and 1120 to pass through the stacked layer 1130 (or the signal gets to the microdevices on the layer 1110 and 1120). In another case, the optical VIA's 1136 and 1132 are formed in the stacked layers 1130 after the stacked layers 1130 is bonded into the backplane 1100. This process enables proper alignment of the opening with the microdevices in stacked layers 1110 and 1120 in the other sub pixels in the backplane. The sidewall of 1132 and 1136 can be coated with passivation and reflective layers.

Microdevices 1020 and 1030 are bonded to the backplane prior to the bonding of the stacked layers 1010. There can be more than one pads or more than two VIA's for each microdevice. A conductive layer can be deposited on top of the microdevices 1020 and 1030 or the stacked layer 1010.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method to combine color from different sources in an optoelectronics device, the method comprising:

having a first array of optoelectronic devices coupled to a waveguide structure;

passing a light from the first array to one side of the waveguide structure or a light from the one side being passed to the first array; and redirecting an input light or an output light on the one side of the waveguide structure by a dichroic mirror in substantially a same direction as a light direction in the waveguide structure, wherein a second array of optoelectronic devices is coupled to the waveguide structure and the waveguide structure passes the light from the first array or the light from the one side to a same direction as the light from the first array, wherein there is a third array of optoelectronic devices coupled to the waveguide structure and a light from the third array is passed to a same direction as the first and second arrays, wherein the first, second and third arrays are made of same devices or different devices, and wherein the first, second and third arrays are different colors to provide for a full color display wherein the waveguide structure merges an output from the first, second or third array and reflects the output from the first, second or third array as one output.

2. The method of claim 1, where an optical device/layer between the first array and the waveguide structure assists in coupling the light from the first array or the light from the one side between the first array and the waveguide structure.

3. The method of claim 1, wherein there is a light coupling structure between the second and third arrays and the waveguide structure.

4. The method of claim 1, wherein the waveguide structure is a stack of different waveguides or a single waveguide.

5. The method of claim 1, wherein the first array includes one or more of micro light-emitting diode (microLED), organic light emitting diode (OLED), quantum dot (QD), sensors, or a stack of different devices including microLED/OLED and QD or microLED/OLED and color filter.

6. The method of claim 1, wherein the first, second and third arrays are made from same optoelectronic devices to increase one characteristic of the first, second, and third arrays wherein the one characteristic includes one or more of a brightness or a resolution.

7. The method of claim 1, wherein the reflection happens at one side of the waveguide structure.

8. The method of claim 7, wherein the dichroic mirror is coupled to the one side of the waveguide structure with a reflected image wherein the dichroic mirror reflects the reflected image to an output that has substantially a same direction of an original image and is different from an output image of the waveguide structure.

* * * * *